(12) United States Patent
Carson

(10) Patent No.: US 10,819,458 B2
(45) Date of Patent: Oct. 27, 2020

(54) INDUX DYNAMICS INDUCER

(71) Applicant: Grant Mitchell Carson, Helena, MT (US)

(72) Inventor: Grant Mitchell Carson, Helena, MT (US)

(73) Assignee: Grant Mitchell Carson, Helena, MT (US)

( * ) Notice: Subject to any disclaimer, the term of this patent is extended or adjusted under 35 U.S.C. 154(b) by 0 days.

(21) Appl. No.: 16/422,996

(22) Filed: May 25, 2019

(65) Prior Publication Data

US 2019/0363812 A1   Nov. 28, 2019

Related U.S. Application Data

(60) Provisional application No. 62/677,098, filed on May 28, 2018.

(51) Int. Cl.
*H03G 3/02*   (2006.01)
*H04H 60/04*   (2008.01)
*G06F 3/16*   (2006.01)

(52) U.S. Cl.
CPC .............. *H04H 60/04* (2013.01); *G06F 3/165* (2013.01); *H03G 3/02* (2013.01)

(58) Field of Classification Search
CPC ............ H04H 60/04; G06F 3/165; G06F 3/02
See application file for complete search history.

(56) References Cited

U.S. PATENT DOCUMENTS

| 4,342,246 | A | * | 8/1982 | Rhodes | ..................... | G10H 3/20 |
| | | | | | | 84/725 |
| 5,317,641 | A | * | 5/1994 | Yasuda | ..................... | H03G 1/02 |
| | | | | | | 381/104 |
| 5,744,744 | A | * | 4/1998 | Wakuda | ..................... | G10H 1/36 |
| | | | | | | 84/610 |
| 2019/0158201 | A1 | * | 5/2019 | Saito | ..................... | H04H 60/04 |

* cited by examiner

*Primary Examiner* — Ping Lee

(57) ABSTRACT

This present invention creates a method of amplitude processing of audio signals, primarily but not exclusively for musical and sound designing purposes. This invention detects the amplitude variations and constancies of a controlling input signal or signals and generates corresponding variations and constancies in another input signal or signals to a specific degree and in a specific manner or combination of manners of operation, at the control of various parameters, rendering a unique and innovative audio effect without changing any frequency content of any signals in the function of the amplitude regulation. This method of amplitude control shall be called amplitude regulation, or amplitude inducing; thus, the invention is titled Indux Dynamics Inducer.

3 Claims, No Drawings

INDUX DYNAMICS INDUCER

RELATED PATENT APPLICATION

This nonprovisional patent application for the invention entitled "Indux Dynamics Inducer" claims the benefit under 35 U.S.C. 119(e) of U.S. Provisional Patent Application No. 62/677,098 likewise entitled "Indux Dynamics Inducer," filed on May 28, 2018, incorporated herein by reference for all purposes.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

This invention pertains to the field of audio processing, primarily but not exclusively for musical and sound designing purposes. This invention is preferably, but not exclusively, for the digital signal processing realm. Its proprietary process and embodiments can be implemented in software on a general and special purpose computer processor and be implemented in hardware or firmware, and a combination thereof. This invention is so innovative that it has created an entirely new category of audio amplitude processing labeled as amplitude regulation, as will be explained throughout the specification. As such, it does not fall under traditional dynamics processing categories, fitting more closely into U.S. Class 1/1, CPC Class H03G 99/00, H03G 1/00, and H03G 2201/50, and H03G 2201/70, which will cover this new principle of inducing audio amplitude variations and constancies, that is, the dynamic content of audio signals, to be explained later.

At the current state of audio signal processing, a problem exists that the dynamic, or amplitude variation and constancy, content intrinsic to an audio signal can only be harnessed to reduce amplitude range of another signal with a method called compression, limit amplitude of another signal at a ceiling with a method called limiting, expand amplitude range of another signal with a method called expansion, or turn on or mute another signal with a method called gating, in addition to more specialized processing tools unrelated to the present invention, such as levelers and transient processors. While all these processing methods and apparatuses have their different uses, the industry still lacks the means to use dynamics, or amplitude signatures, that is, audio signal amplitude variation and constancy over time, of single or multiple audio signals, called the controlling signals to regulate the amplitude of other selected signals in a way that the other selected signals begin to take on an exact or altered amplitude signature of the controlling signals without changing any of their frequency content. For example, at the current state of audio technology, an audio track of a drum kit may be used to attenuate the audio signal of a piano whenever the drums are struck, via compression, or can be used to tell the piano signal to turn on and off, via gating, or even expand the piano's dynamic range, via expansion, yet there is no processing method or apparatus in existence to take the intrinsic amplitude variations and constancies of the drum track and use them to correspondingly shape the amplitude of the piano, causing the transient striking nature of the drums to add to or completely alter the sustaining sound of the piano while maintaining the piano's original frequencies and thus preserving the piano's original tone. A music mixing engineer currently has no means to use the amplitude variations and constancies of selected audio tracks to automatically create corresponding variations and constancies in other tracks. This invention opens limitless new opportunities for both musical and non-musical sound design by allowing users to automatically influence and control amplitude signatures of chosen audio signals with other selected signals' amplitude signatures. For example, a musician may use the present invention to make synthesizer tracks with differing tones share amplitude variations to a select degree and manner and thus sound cohesive and united while maintaining their individual tones of frequency; whereas with current industry processors, amplitude control would consist only of expanding the synthesizers' amplitude range with an expander, assigning a ceiling for the synthesizers' amplitude with a limiter, muting or unmuting the synthesizer signals with a gate, attempt to roughly use a volume fader to match volume levels, and so on. Without the processing capabilities of the present invention, Indux Dynamics Inducer, the audio industry is missing a significant and powerful tool for music creation, sound design, and other fields of audio production.

BRIEF SUMMARY OF THE INVENTION

The following summary is intended to give a brief overview of the invention and is not to be construed to limit the scope of the claims. The general idea of the present invention is to provide a novel method and apparatus for audio processing, which enables a user to regulate amplitude of waveform of an input audio signal or signals with amplitude variations and constancies of waveform of a controlling audio signal or signals so that detected amplitude variations and constancies, that is, increases and decreases and flatness of amplitude, are used to automatically generate identical or modified variations and constancies of amplitude in the waveform of affected signal or signals in one of three selectable manners of operation or a combination thereof as claimed in the claims, all without altering the frequency content of any input signal in any manner or combination of manners of the function of amplitude regulation. This solves the audio industry's problem of missing a method and tool for amplitude regulation. To note, the term "signal" in the scope of this writing is always used to mean audio signal. The present invention's novel amplitude regulation function strictly affects signal amplitude and not signal frequency. While frequency content of a regulating signal or signals can be altered to achieve a different amplitude regulating effect, the present novel process of the amplitude regulation does not alter the frequency of any signals in its function of operation. Because of the present invention's object of inducing amplitude variation in signals, it is to be hence called "Indux Dynamics Inducer." "Indux," the first part of the title, stems from the Latin word "induxi" which means to influence or induce. Pursuant to this etymology, "Indux Dynamics Inducer" influences and "induces" amplitude variations and constancies in one signal according to amplitude variations and constancies of another signal, to use oversimplified terms. A more technical name for the present processing method and apparatus would be "audio amplitude regulator." The signal or signals input into the present invention's apparatus which are used to the control the invention's effect shall be called the controlling signal or signals. The input signal or signals receiving the effect will be called the affected signal or signals, as they will receive the effect of the amplitude regulation. For the sake of clarity, in examples presented, there will be one controlling signal and one affected signal, but this shall not be construed to limit the present invention to a single controlling signal and single affected signal. Amplitude variations and constancies shall be defined as increases, decreases, and flatness in amplitude intrinsic to the waveform of audio signals, not changes and levels in volume and gain performed upon a signal by processing apparatuses, as this is a completely different process. Also, amplitude shall not be construed to mean amplification. Amplification processing adds or removes gain from a signal and does not alter amplitude variations and constancies intrinsic to signal waveform amplitude as the present invention does. Amplification simply adds or takes away gain from the audio content. Terms such as gain and volume imply changes and levels of amplification, which are different from amplitude variations and constancies intrinsic to the waveform of an audio signal; therefore, terms such as gain and volume are not used to describe the present invention's novel method and apparatus.

While the present invention can be embodied through both digital and analog processing apparatuses; it is best embodied in a computer software plug-in for digital signal processing, the industry standard method for achieving audio effects for music and sound design, yet it can also be embodied in analog hardware or firmware.

The object of Indux Dynamics Inducer is demonstrated by the following examples. An advantage of the present invention involves the functionality exclusive to its novel method and apparatus, allowing tonal or atonal musical and non-musical signals of similar and differing pitch and timbre to share, match, and infuse amplitude variations and constancies with each other in music creation and non-musical sound design, a feat impossible with existing processors. This novel effect can be used for innumerable purposes, one of which would be to unite the amplitude variations and constancies of different signals of varying tone to generate a perceived effect of a single signal with richer harmonic content than either of the original signals, an effect which no other processor in existence can achieve. In addition to matching amplitude to unite harmonic content, another potential of this invention involves adding natural dynamic qualities to flat-sounding synthesizers and other flat-sounding signals. In so many musical cases, aside from a harshly sterile and basic amplitude envelope, synthesizers produces a dynamically flat sound, with little to no natural variation in amplitude, which acoustic instruments by nature possess. To show an advantage of the present invention, a user can automatically add natural, nuanced amplitude variation by using a natural-sounding acoustic or electronic source such as a human voice or an instrument to regulate the amplitude of dynamically flat-sounding signals. The user can completely conform the synthesizers to the natural source's amplitude variations or partially infuse the natural amplitude variations with the original synths' amplitude content for a more subtle effect. In addition to uses of creating and designing sounds, the present invention can refine and sculpt sounds in mixing and mastering processes. Indux Dynamics Inducer solves the problem of audio tracks in a mix not being able to regulate each other's amplitude. Compressors and mixing and mastering processors cannot add selected signals' amplitude signatures to other signals. The present invention's function of automatically sharing amplitude signatures between tracks can add unique clarity and coherency to a music mix which no processing tool in existence can provide, and which cannot be attempted manually.

DETAILED DESCRIPTION OF INVENTION

The following is a description of the preferred embodiment of the present invention. While the present invention can be embodied in hardware, the best mode of its operation involves embodiment in a computer software plug-in for digital signal processing. This embodiment provides ease of distribution to consumers and flexibility of use; thus, the present invention's digital software embodiment will be closely examined and described. This shall not be construed to limit the present invention to any other embodiment within the scope of the appended claims.

The present invention's computer software plug-in may be operated within a digital audio workstation. Computer users will insert this plug-in onto any desired audio tracks in a digital audio workstation to process the audio signals present on those tracks. The best mode of this embodiment's operation depends on artistic choice of the user, who will select a manner of operation or combination of manners of operation most desired for a particular processing purpose at hand. To note, items mentioned in the singular may be in singular for explanation's sake and shall not be construed to limit the functionality of the present invention; multiple audio tracks and signals may control the effect and receive the effect of the present invention. The user selects an audio track desired to receive an effect of the present invention. This selected track is to be called the affected track. The user then inserts the computer software plug-in of the present invention onto the track, then selects a different track, to be called the controlling track, to perform the amplitude regulation upon the affected track. The user then routes the controlling track's signal using the digital audio workstation into the side-chain input, that is, the additional signal input port, of the plug-in on the affected track using a graphical user interface. This user interface is another part of the embodiment of the present invention. Now that the plug-in is receiving both the affected signal and the controlling side-chain signal, the user uses the plug-in's graphical user interface to select a manner or combination of manners of operation which produce the preferred type of effect on the audio material at hand. Once a manner or combination of manners of operation is set, the user may alter the timing, frequency, and other characteristics of the controlling signal within the graphical user interface to alter the amplitude regulation effect, as claimed in the appended claims. The user can view the plug-in's operation in real-time by viewing provided windows which graphically display audio waveform. Meters on the interface can graphically display information such as amplitude addition and reduction, input signal and output signal levels, and so on.

If the user manually selects or the apparatus automatically selects the first manner of operation as claimed in claim 1, then this manner dictates that the apparatus must cause an increase in value of amplitude of the affected signal at an increase in value of amplitude of the controlling signal and a decrease in the value of amplitude in the affected signal at a decrease in the value of amplitude of the controlling signal and a constancy in the value of amplitude of the affected signal at a constancy in the value of amplitude of the controlling signal, all such that the value of amplitude of the affected signal is equal to or less than the value of amplitude which it would have without regulation by the controlling signal. The plug-in will then detect and measure the amplitude variations and constancies of the controlling signal and induce corresponding increases and decreases in amplitude in the affected signal, to the percentage of intensity set by the user on a mix knob, which controls the degree or percentage of the amplitude regulating effect. If the mix knob is set at 0%, there is no amplitude change in the affected signal, and if the mix knob is set at 50%, the amplitude variations and constancies are applied to the affected signal at 50% of their amplitude. If the mix knob is set at 100%, variations and constancies are applied at 100% of their amplitude; if the mix knob is set at 150%, variations and constancies are applied at 1.5 times original amplitude, and so on. This first manner of operation restricts the amplitude of the affected signal from increasing beyond the affected signal's original amplitude level before the regulation effect. The controlling signal cannot add amplitude to the affected signal if the controlling signal has a higher amplitude than the affected signal. To allow the controlling signal to add increases in amplitude to the affected signal past the affected signal's original amplitude, the user can use the graphical user interface to attenuate the overall amplitude level of the controlling signal to below the amplitude level of the affected signal, or increase the overall amplitude level of the affected signal, or a combination thereof, until the amplitude levels of the different signals reach the range at which desired additions in amplitude caused by the controlling signal are achieved. The object of this restricting rule for this manner of operation is to prevent undesired increases in overall amplitude levels in the affected signal, thus preventing undesired increases in volume.

If the user manually selects or the apparatus automatically selects the second manner of operation as claimed in claim 1, this manner dictates that the apparatus must cause an increase in the value of amplitude of the affected signal at an increase in the value of amplitude of the controlling signal and a decrease in the value of amplitude of the affected signal at a decrease in the value of amplitude of the controlling signal and a constancy in the value of amplitude of the affected signal at a constancy in the value of amplitude of the controlling signal, all such that the amplitude value of the affected signal is never reduced below the amplitude value which it would have without regulation by the controlling signal. The plug-in will then detect and measure the amplitude variations and constancies of the controlling signal and induce corresponding increases and decreases and constancies in amplitude in the affected signal, to the percentage of intensity set by the user on the mix knob. If the mix knob is set at 0%, there is no amplitude change in the affected signal, and if the mix knob is set at 50%, the amplitude variations and constancies are applied to the affected signal at 50% of their amplitude. If the mix knob is set at 100%, variations and constancies are applied at 100% of their amplitude: if the mix knob is set at 150%, variations and constancies are applied at 1.5 times original amplitude, and so on, keeping the affected signal at or above its original amplitude level. This second manner of operation restricts the affected signal's amplitude from decreasing below its original amplitude level before the regulation effect. Therefore, the controlling signal cannot cause a decrease in amplitude in the affected signal if the controlling signal has a lower amplitude than the affected signal. To cause this decrease, the user can use the graphical user interface to boost the overall amplitude level of the controlling signal to above the amplitude level of the affected signal or decrease the overall amplitude level of the affected signal, or a combination thereof, until the signals reach the amplitude range at which desired decreases in amplitude caused by the controlling signal are achieved. The object of this restricting rule for this second manner of operation is to maintain a minimum amplitude level in the affected signal, preserving the minimum original volume level of the affected signal's track.

If the user manually selects or the apparatus automatically selects the third manner of operation as claimed in claim 1, this manner, which features two functions, dictates that the apparatus must cause an increase in the value of amplitude of the affected signal at an increase in the value of amplitude of the controlling signal and a decrease in the value of amplitude of the affected signal at a decrease in the value of amplitude of the controlling signal and a constancy in the value of amplitude of the affected signal at a constancy in the value of amplitude of the controlling signal, causing the affected signal to either match amplitude values to the exact values of the controlling signal or match amplitude increases and decreases and constancies of the controlling signal proportionally, or to match amplitude through a combination of exact values and proportions. The function of exact amplitude matching and the alternate function of proportional amplitude matching, or a combination thereof, can be selected manually and automatically by the user and apparatus. Within the exact function, the apparatus processes amplitude at exact values, rather than proportional values relative to total signal values. The affected signal will match the exact amplitude values of the controlling signal without regard to proportions. For example, if a controlling signal has a detected amplitude value of X, the apparatus will automatically change the affected signal value to X to match the controlling signal value exactly. Within the proportional function, the controlling signal's amplitude changes are measured as proportions of the total amplitude values of the controlling signal. The apparatus applies these proportions to create changes in the affected signal proportional to the total amplitude of the affected signal. The present invention's plug-in will detect and measure the amplitude variations and constancies of the controlling signal and induce matching increases and decreases and constancies of amplitude in the affected signal, to the percentage of intensity set by the user on the mix knob. If the mix knob is set at 0%, there is no amplitude change in the affected signal. If the mix knob is set at 50%, the amplitude variations and constancies are applied to the affected signal at either 50% of their exact amplitude values or 50% of their proportional values relative to the controlling signal's amplitude, or a combination thereof. If the mix knob is set at 100%, the amplitude variations and constancies are applied to the affected signal at either 100% of their exact amplitude values or 100% of their proportional values relative to the controlling signal's amplitude, or a combination thereof. If the mix knob is set at 150%, amplitude is regulated at 1.5 times exact amplitude values or proportional values, or a combination thereof, and so on.

Both the user and the apparatus can automatically and manually select a combination of manners of operation, as claimed in claim 1. The plug-in apparatus can combine differing rules of operation in a logical way, and can also automatically alternate between different manners of operation depending on user-controlled parameters and the characteristics of input signals.

Per claim 5, to further refine the effect of the present invention, timing, amplitude, and frequency altering controls may be provided in the interface which can alter the content of the controlling signal to change the way it affects the affected signal. To note, the original controlling signal is not altered, only a copy used to control the plugin is altered.

Also, frequency content of the controlling signal can be altered outside of the amplitude regulation function to change the way the amplitude regulation functions, but the present invention does not alter any signal's frequency content by the function of its amplitude regulation processing, as claimed in the appended claims. The present invention does not alter the frequencies of any signal by its method of operation, but the user can modify the controlling signal's frequencies with controls to change the profile of the controlling signal when it affects the affected signal. To illustrate this principle, if a drum track acts as a controlling signal, the user can use the plug-in's graphical user interface to attenuate bass frequencies of the drum signal, thus allowing only the mid and high frequencies of the drum signal to control the amplitude regulation of an affected track's signal.

The foregoing describes the preferred embodiment of the present invention and the best mode of its operation, but the present invention shall not be construed to be limited to the foregoing embodiment. Modifications of the present invention may occur to persons skilled in the art, and the invention should only be limited by the appended claims.

To distinguish the present invention from other inventions in the audio processing field, specifically, the dynamics processing field, I will compare my invention to other dynamics processing tools and explain the difference, demonstrating the uniqueness of Indux Dynamics Inducer. No other processing apparatus can achieve the novel effect of the present invention.

This invention differs from gates and expanders. An audio gate allows the affected signal to turn on or become louder when passing a selected threshold of amplitude, and an expander increases the difference between highs and lows of amplitude of a signal according to a selected threshold of amplitude. The novel amplitude regulation effect of the present invention cannot be replicated by gates or expanders. A gate can only make an affected signal turn on or off when a controlling signal passes an amplitude threshold, whereas Indux Dynamics Inducer creates amplitude variations and constancies in an affected signal parallel to the variations and constancies of a controlling signal. Similarly, an expander can only increase the range of amplitude of an affected signal, it cannot create amplitude variations and constancies in an affected signal parallel to the variations and constancies of a controlling signal.

The present invention is distinct from a morphing processor. While a morphing processor, such as a vocoder or similar processors, may use the amplitude envelope qualities of one sound to morph another signal or generate a new signal based on the original, this morphing field differs from the present invention's principle of amplitude regulation, as morphing processors by nature alter the frequencies of the affected signal, changing their tone. The present invention completely avoids altering the frequencies of the signals which it affects, as the goal of the present invention is to share amplitude variation content between differing tracks, rather than morph one track into a different tone.

To show how the present invention differs from an ambient noise compensator: The purpose of an ambient noise compensator is to match the volume of one signal to another signal, or potentially raise the volume above the other signal, the other signal being the ambient noise signal, so that the first signal may be discerned amidst ambient noise, such as noise at a crowded venue that would mask the sound of music playing on speakers. The principle of ambient noise compensation is to raise, or potentially lower, the overall average volume of a signal to be discernible amidst ambient noise, it does not use amplitude variations and constancies of a controlling signal generate corresponding variations and constancies in a different signal, it merely turns the volume of one signal up to be audible against another sound, an effect completely different than the present invention's principle of amplitude regulation.

The present invention is also clearly different from compressors, limiters, and levelers, which are designed to reduce the range of, limit the ceiling of, and control the level of amplitude of a signal. In contrast to the present invention, compressors reduce the dynamic range of a signal's amplitude, they cannot apply one signal's amplitude variations and constancies upon another signal to induce corresponding variations and constancies in the other signal. Also in contrast, limiters prevent amplitude levels from increasing higher than a certain point; this functionality is clearly different than the present invention, which instead takes one signal's amplitude and uses it to regulate the amplitude of another signal to induce matching variations and constancies. Further in contrast, a leveler, also known as an automatic gain controller, increases or decreases the level of a signal over time to maintain a desired level, it does not add amplitude variations and constancies to a signal based on amplitude variation of another signal as the present invention does. To make terms clear, level and gain are to be distinguished from amplitude. Level implies a set volume level which can be raised or lowered with increases or decreases in signal gain, adding or subtracting a fixed amount of gain from the signal, thus preserving all original variations and constancies of amplitude, only making the signal louder or softer. In contrast, the present invention changes the variations and constancies of a signal based on the variations and constancies of a controlling signal. Clearly, compressors, limiters, and levelers are completely different from the present invention in purpose and functionality.

The present invention is also different from faders. A fader cannot track the variations and constancies of a signal's amplitude and induce matching variations and constancies in another signal. A fader adds or removes gain from a signal while preserving the signals amplitude signature, it cannot alter the pattern of amplitude variation and constancy of any signal, as the present invention does. A fader cannot detect amplitude changes and constancies of a signal and apply them to another signal, which the present invention does.

It must also be noted that many existing technologies such as gates, expanders, compressors, and limiters require setting a threshold of amplitude which must be passed in order to make their effect. The present invention requires no set threshold to make its effect; instead, it can continuously operate regardless of the levels of any input signal. The present invention creates an entirely new category and method of amplitude processing, different from all existing dynamics processing tools. All the functions of the aforementioned tools combined cannot produce the effect of the present invention.

What is claimed is:

1. An audio signal processing apparatus for inducing variation in amplitude and shape of an original audio track to variation and shape of a second audio signal comprising:
   an interface for receiving said first original track and said second audio signal with original amplitude,
   a mixer knob for defining a percentage,
   a trigger button for trigger mode,
   a push button for push mode,
   an EQ button,
   a first display for displaying a waveform of the original track, and a second display for displaying a waveform of said second signal after modification;

wherein when said EQ button is pressed, said first display allows a user to control which frequencies of said original track being used to modifying said second signal;

wherein the audio signal processing apparatus is operated in either trigger mode or push mode to modify the second signal, and the second display displays the waveform of said second signal after the modification in either trigger mode or push mode;

wherein by pressing said trigger button for activating the trigger mode, the user turns said mixer knob for setting a mix percentage of the original amplitude of said second signal to be attenuated; with the mix percentage at full during the trigger mode, said second signal is completely attenuated until said original track has an envelope, wherein the envelope of said original track triggers a matching dynamic increase and decrease in the envelope of said second signal; at 50% mix percentage during the trigger mode, the original amplitude of said second signal is 50% attenuated until said original track has an envelope, said second signal after modification at 50% mix percentage during the trigger mode includes 50% of original amplitude of the second audio signal and the other 50% following the dynamic increase and decrease in the envelope of the original track;

wherein by pressing said push button for activating the push mode, the amplitude of said original track is added to the original amplitude of said second audio signal; during the push mode, the amplitude of said second signal after modification is higher than the original amplitude of said second signal.

2. The audio signal processing apparatus of claim 1, further comprising an input gain control knob, an output gain control knob, a first meter and a second meter; wherein said first meter shows the input gain of said second signal before modification during the trigger mode or the push mode according to the adjustment of the input gain control knob, the second meter shows the output gain of second signal after the modification during the trigger mode or the push mode according to the adjustment of the output gain control knob.

3. The audio signal processing apparatus of claim 1, further comprising four additional knobs for attack, decay, sustain and release, respectively, when one of the four additional knobs is activated, the envelope of the original track is modified, the envelope of said second signal results in a shape according to a modified envelope of the original track based on a function of said one of the four additional knobs being activated when the trigger mode or the push mode is activated.

* * * * *